(12) United States Patent
Yen et al.

(10) Patent No.: US 11,631,633 B2
(45) Date of Patent: Apr. 18, 2023

(54) SUBSTRATE STRUCTURE, SEMICONDUCTOR PACKAGE STRUCTURE AND METHOD FOR MANUFACTURING SEMICONDUCTOR PACKAGE STRUCTURE

(71) Applicant: Advanced Semiconductor Engineering, Inc., Kaohsiung (TW)

(72) Inventors: You-Lung Yen, Kaohsiung (TW); Kuang-Hsiung Chen, Kaohsiung (TW); Bernd Karl Appelt, Holly Springs, NC (US)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/204,833

(22) Filed: Mar. 17, 2021

(65) Prior Publication Data
US 2022/0301989 A1 Sep. 22, 2022

(51) Int. Cl.
*H01L 23/495* (2006.01)
*H01L 23/31* (2006.01)
*H01L 21/768* (2006.01)
*H01L 21/50* (2006.01)

(52) U.S. Cl.
CPC ........ *H01L 23/49534* (2013.01); *H01L 21/50* (2013.01); *H01L 21/76801* (2013.01); *H01L 23/31* (2013.01); *H01L 23/49541* (2013.01)

(58) Field of Classification Search
CPC ......... H01L 23/49534; H01L 23/49541; H01L 23/49548; H01L 23/49558; H01L 23/31; H01L 23/3157; H01L 23/28; H01L 23/3135
See application file for complete search history.

(56) References Cited

U.S. PATENT DOCUMENTS

2017/0162494 A1* 6/2017 Hsiao ................. H01L 24/11
2022/0068896 A1* 3/2022 Kwon ................ H01L 23/5389

FOREIGN PATENT DOCUMENTS

KR 20160149612 A * 12/2016 ....... H01L 23/49827

* cited by examiner

*Primary Examiner* — Thanhha S Pham
(74) *Attorney, Agent, or Firm* — Foley & Lardner LLP

(57) ABSTRACT

A substrate structure and a semiconductor package structure including the same are provided. The substrate structure includes a circuit layer and a dielectric structure. The circuit layer has a bottom surface and a top surface opposite to the bottom surface. The dielectric structure around the circuit layer. The dielectric structure covers a first part of the bottom surface of the circuit layer, and exposes a second part of the bottom surface and the top surface of the circuit layer. The dielectric structure exposes the top surface of the circuit layer. In addition, a method of manufacturing a semiconductor package structure is also provided.

9 Claims, 18 Drawing Sheets

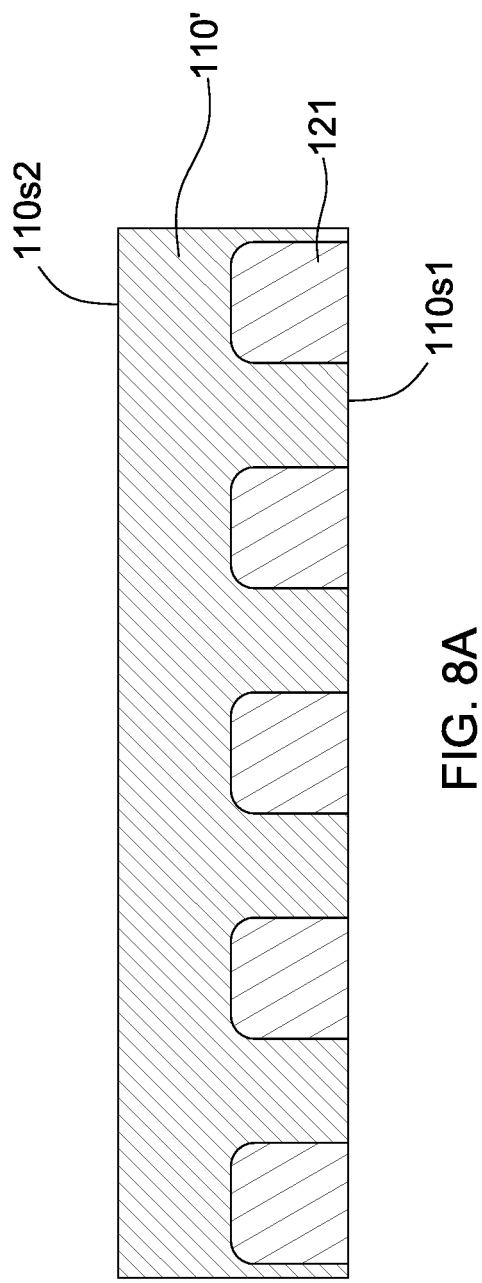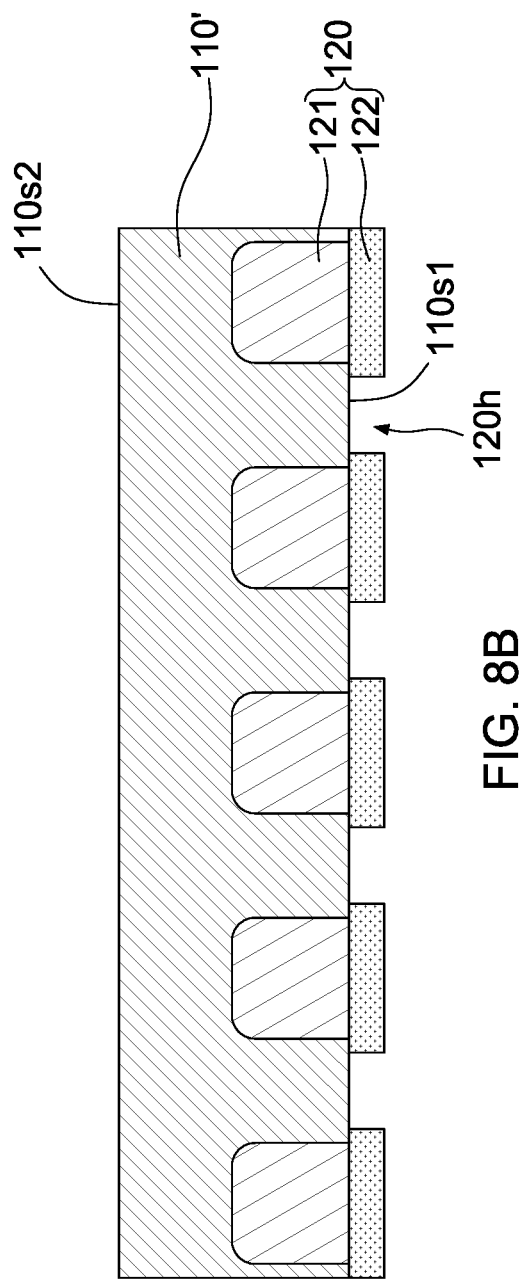

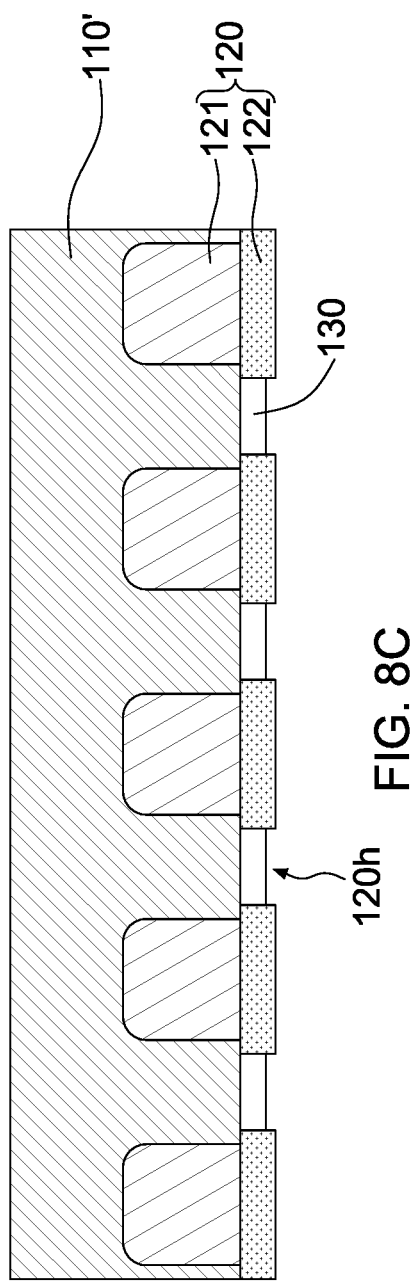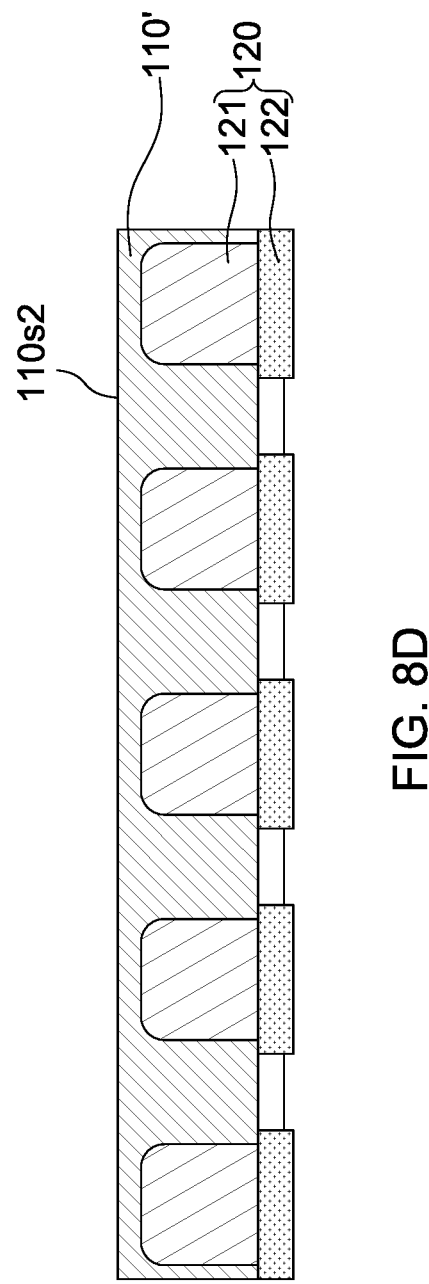

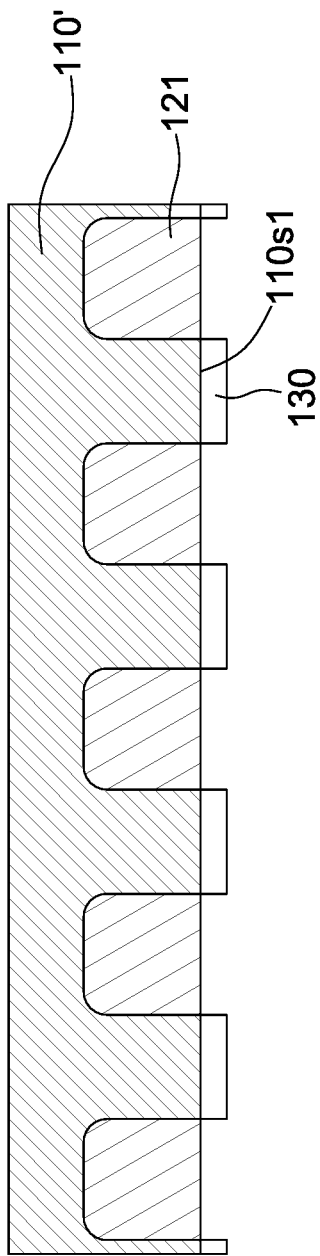
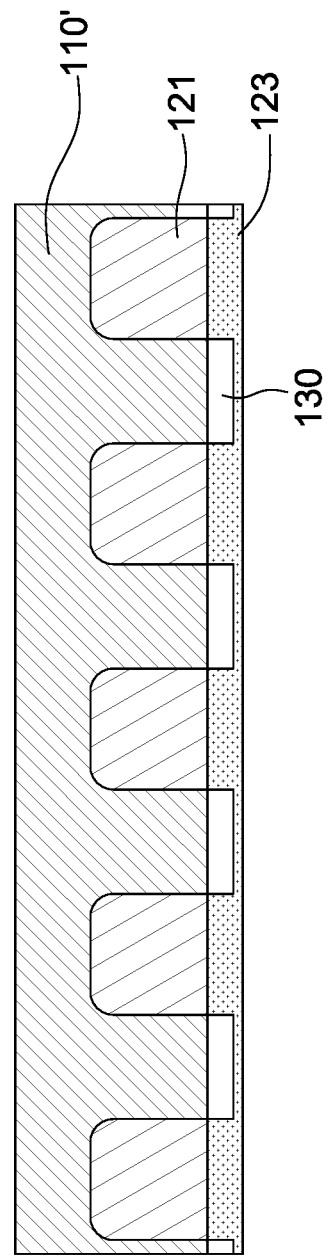
FIG. 9A
FIG. 9B

SUBSTRATE STRUCTURE, SEMICONDUCTOR PACKAGE STRUCTURE AND METHOD FOR MANUFACTURING SEMICONDUCTOR PACKAGE STRUCTURE

BACKGROUND

1. Field of the Disclosure

The present disclosure relates to a substrate structure including a protecting layer, in particularly to a semiconductor package structure including the same.

2. Description of the Related Art

Pre-mold lead frame substrate or molded lead substrate (hereinafter referred to as "substrate structure") have been widely used in many products, such as automotive electronic components. Due to mismatch of coefficient of thermal expansion (CTE), the current substrate structure may be found cracks formed at an interface of different materials (e.g., the interface between a pad and a dielectric layer), causing the substrate structure to be prone to delamination at the interface. Further, cracks can be found at the corner of the pad, resulting in oxidation of the pad. The aforementioned problems decrease the reliability of the products. Therefore, a new substrate structure is required.

SUMMARY

In some embodiments, a substrate structure includes a circuit layer and a dielectric structure. The circuit layer has a bottom surface and a top surface opposite to the bottom surface. The dielectric structure around the circuit layer. The dielectric structure covers a first part of the bottom surface of the circuit layer, and exposes a second part of the bottom surface and the top surface of the circuit layer. The dielectric structure exposes the top surface of the circuit layer.

In some embodiments, a semiconductor package structure includes a first circuit layer, an electronic component and a dielectric structure. The first circuit layer has a bottom surface and a top surface opposite to the bottom surface, and the first circuit layer has a plurality of sections separated from each other. The electronic component is disposed on the top surface of the first circuit layer. The dielectric structure covers a portion of the bottom surface of the first circuit layer and connects the plurality of sections of the first circuit layer In some embodiments, a method for manufacturing a semiconductor package structure includes: (a) providing a conductive layer having a bottom surface and a top surface opposite to the bottom surface; (b) removing a portion of the bottom surface of the conductive layer to form a plurality of recesses; (c) forming a first dielectric layer in the plurality of recesses and expose the bottom surface of the conductive layer; (d) forming a protection layer to cover the bottom surface of the conductive layer; (e) after step (d), patterning the conductive layer to form a circuit layer comprising plurality of sections separated from each other.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIGS. 8A, 8B, 8C, 8D, 8E and 8F illustrate various stages of an example of a method for manufacturing a semiconductor package structure according to some embodiments of the present disclosure.

FIGS. 9A, 9B, 9C and 9D illustrate various stages of an example of a method for manufacturing a semiconductor package structure according to some embodiments of the present disclosure.

DETAILED DESCRIPTION

Figure 1:
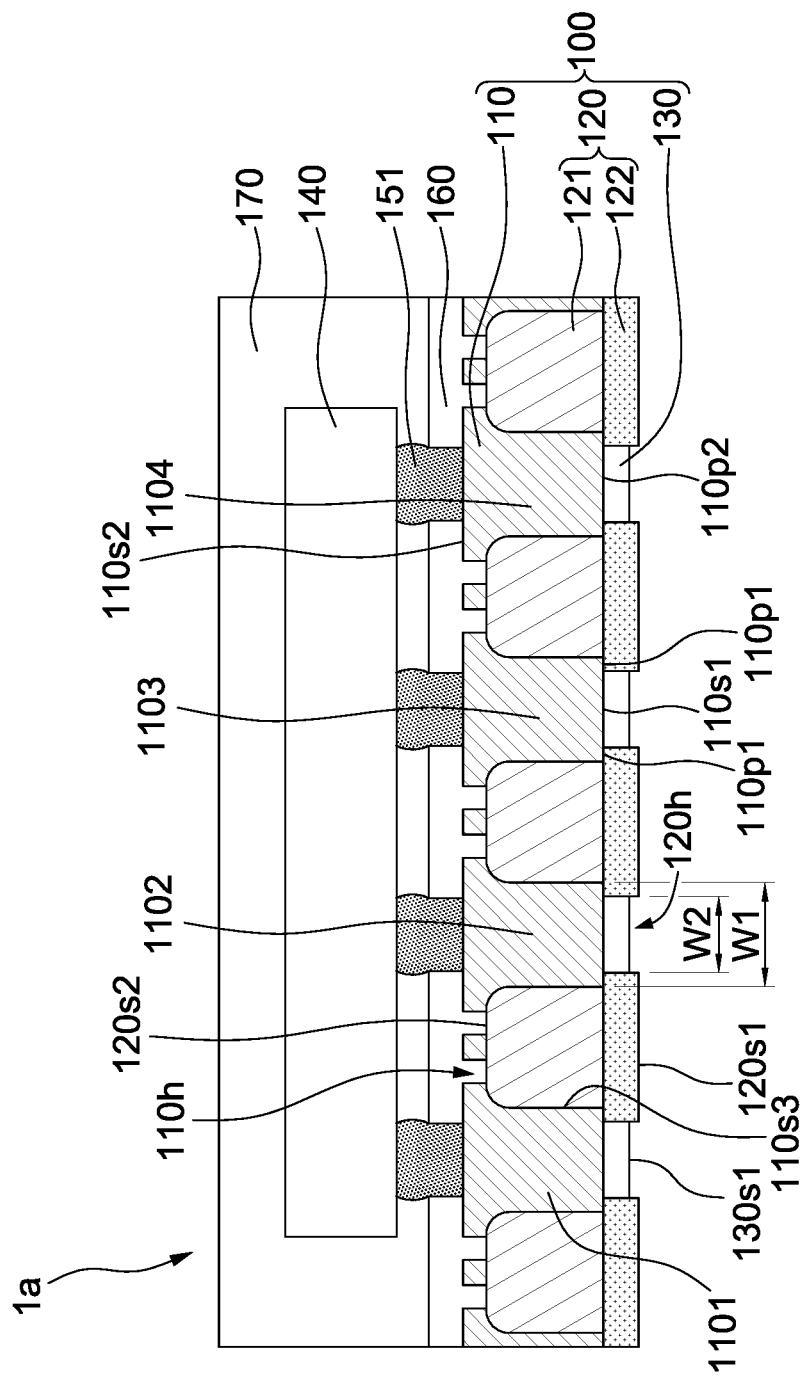
FIG. 1 illustrates a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an example of a semiconductor package structure 1a according to some embodiments of the present disclosure. In some embodiments, the semiconductor package structure 1a may include a substrate structure 100 and an electronic component 140.

In some embodiments, the substrate structure 100 may include a circuit layer 110, a dielectric structure 120 and a protection layer 130. The substrate structure 100 may be applicable to a semiconductor package structure, such as a semiconductor package structure including an automobile electronic component or other electronic components.

The circuit layer 110 may be configured to electrically connect the electronic component 140 and other electronic component(s). The circuit layer 110 may include conductive material, such as metal or other suitable material. For example, the circuit layer 110 may include copper (Cu), silver (Ag), aluminum (Al), gold (Au), or an alloy thereof.

The circuit layer 110 may have a surface 110s1 (or a bottom surface), a surface 110s2 (or a top surface) opposite to the surface 110s1 and a surface 110s3 (or a lateral surface) extending between the surface 110s1 and the surface 110s2. The circuit layer 110 may include a plurality of sections 1101, 1102, 1103 and 1104. The sections 1101, 1102, 1103 and 1104 may be separated from each other through the dielectric structure 120. Each of the sections 1101, 1102, 1103 and 1104 may have the surfaces 110s1, 110s2 and 110s3, respectively.

The dielectric structure 120 may surround or be around the circuit layer 110 and separate the plurality of sections 1101, 1102, 1103 and 1104 from each other. The dielectric structure 120 may be in contact with and connect the plurality of sections 1101, 1102, 1103 and 1104. The dielectric structure 120 may have a surface 120s1 (or a bottom surface) and a surface 120s2 (or a top surface) opposite to the surface 120s1. In some embodiments, a portion of the dielectric structure 120 may be exposed from the surface 110s2 by a plurality of trace spaces 110h (or line spaces). The trace spaces 110h may be defined by the circuit layer 110.

In some embodiments, the dielectric structure 120 may include a portion 121 (or a dielectric layer) covering the surface 110s3 of each of the sections 1101, 1102, 1103 and 1104. In some embodiments, the dielectric structure 120 may define a plurality of openings 120h to expose a portion of the circuit layer 110, such as the surface 110s1 of the sections 1101, 1102, 1103 and 1104. The dielectric structure 120 may include a portion 122 (or a dielectric layer) covering a portion of the surface 110s1 of the circuit layer 110. More specifically, the portion 122 of the dielectric structure 120 may cover a portion 110p1 of the circuit layer 110, and a portion 110p2 of the circuit layer 110 may be exposed from the dielectric structure 120. In some embodiments, the portion 122 of the dielectric structure 120 is in contact with the portion 110p1 of the circuit layer 110. In some embodiments, one of the plurality of sections 1101, 1102, 1103 and 1104 of the circuit layer 110 has a width W1 at the surface 110s1, and one of the plurality of opening 120h defined by the dielectric structure 120 has a width (or an aperture) W2. In some embodiments, the width W1 of the circuit layer 110 is greater than the width W2 of the opening 120h of the dielectric structure 120. In some embodiments, a portion of the surface 120s2 of the dielectric structure 120 is covered by the circuit layer 110. In some embodiments, a portion of the circuit layer 110 may protrude from the surface 110s2 of the dielectric structure 120.

In some embodiments, the dielectric structure 120 may cover the corner, defined by the surface 110s1 and the surface 110s3, of the circuit layer 110 to lock the circuit layer 110, which may prevent the circuit layer 110 from delamination during the manufacturing the semiconductor package structure 1a. In some embodiments, the dielectric structure 120 may be in contact with a portion of the surface 110s1 and a portion of the surface 110s3 of the circuit layer 110. The dielectric structure 120 may include dielectric materials, such as a photo-sensitive material or other suitable materials. In some embodiments, the material of the portion 121 may be the same as that of the portion 122. In this embodiment, the portion 121 and the portion 122 collaboratively lock the circuit layer 110 such that the overall structure of the substrate structure 100 become much more robust.

The protection layer 130 may be disposed on the surface 110s1 of the circuit layer 110. In some embodiments, the protection layer 130 may be disposed in the opening 120h of the dielectric structure 120 to cover the surface 110s1 of the circuit layer 110. The protection layer 130 may be configured to protect the circuit layer 110 from oxidation or generating intermetallic compound (IMC). In some embodiments, the protection layer 130 may be a conductive protection layer. For example, the protection layer 130 may include a metal or an organic solderability preservative (OSP). In some embodiments, the protection layer 130 may be a metal finish layer, such as NiAu, NiPd, NiPdAu or other suitable materials. In some embodiments, the protection layer 130 may be disposed on the surface 110s1 of each of the sections 1101, 1102, 1103 and 1104. In some embodiments, the protection layer 130 is free from vertically (may be defined as a direction substantially orthogonal to the interface of the surface 110s1 of the circuit layer 110) covering of the dielectric structure 120. In some embodiments, the portion 110p1 of the circuit layer 110 is free from vertically overlapping the protection layer 130. The protection layer may have a surface 130s1 facing away from the circuit layer 110. In some embodiments, the surface 130s1 of the protection layer 130 is not coplanar with the surface 120s1 of the dielectric structure 120. In some embodiments, the surface 120s1 of the dielectric structure 120 has an elevation (or height) lower than that of the surface 130s1 of the protection layer 130. That is, the surface 130s1 of the protection layer 130 may be recessed from the surface 120s1 of the dielectric structure 120. In some embodiments, the width of the protection layer 130 is less than the width W1 of the one of the sections 1101, 1102, 1103 and 1104 of the circuit layer 110.

The electronic component 140 may be disposed on the substrate structure 100. For example, the electronic component 140 may be disposed on the surface 110s2 of the circuit layer 110. The electronic component 140 may include one or more integrated circuits (ICs). In some embodiments, the electronic component 140 may include a power chip or other suitable electronic components. In some embodiments, the electronic component 140 may include, but is not limited to, at least one active component such as MEMS die or another active component. In some embodiments, the electronic component 140 may include, but is not limited to, at least one passive component such as a capacitor, a resistor, or another passive component. The electronic component 140 may be electrically connected to the circuit layer 110.

In some embodiments, the semiconductor package structure 1a may further include conductors such as solder balls 151. The solder ball 151 may be disposed between the circuit layer 110 and the electronic component 140 for electrically connecting them.

In some embodiments, the semiconductor package structure 1a may further include a mask layer 160 such as a solder mask. The mask layer 160 may be disposed on the surface 110s2 of the circuit layer 110. A portion of the mask layer 160 may be disposed in the trace space 110h of the circuit layer 110. The mask layer 160 may be patterned such that the mask layer 160 may have a plurality of openings for accommodating the solder ball 151. The mask layer 160 may include, for example, a solder resist layer or other suitable materials.

In some embodiments, the semiconductor package structure 1a may further include a package body 170. The package body 170 may be disposed on the mask layer 160. The package body 170 may cover the electronic component 140 and the solder balls 151. The package body 170 may be a molding compound with or without fillers, or a dielectric layer, and may include, or be formed from, a photoresist layer, a cured photosensitive material or a cured photoimageable dielectric (PID) material. For example, the package body 170 may include a polyamide (PA), an Ajinomoto build-up film (ABF), a bismaleimide-triazine (BT), a polyimide (PI), epoxy or polybenzoxazole (PBO), or a combination of two or more thereof.

In this embodiment, the substrate structure 100 includes a dielectric structure 120 locking the circuit layer 110 to relieve the stress imposed on the corner of the circuit layer 110. Further, the substrate structure 100 includes a protection layer 130 covering the circuit layer 110 to prevent the circuit layer 110 from oxidation or generating IMC. Therefore, the reliability of the semiconductor package structure 1a is improved.

Figure 2:
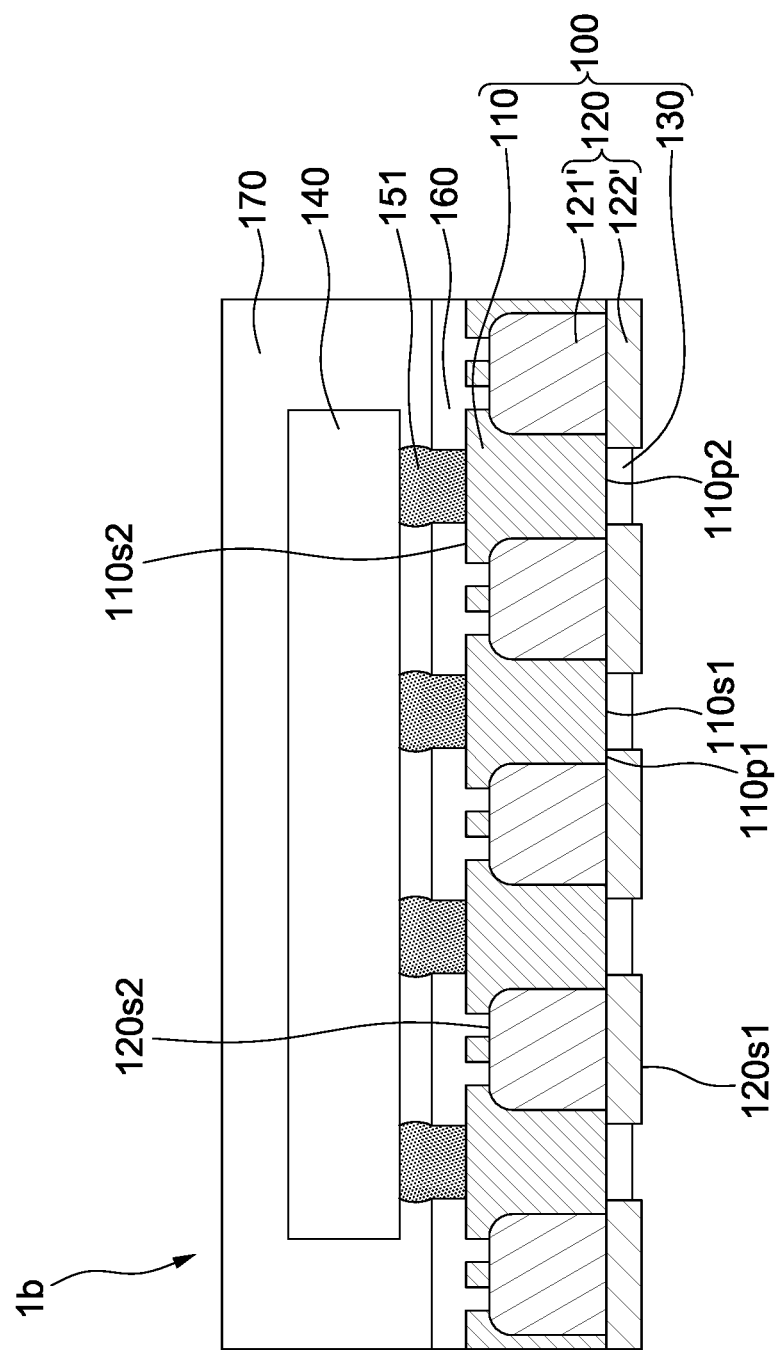
FIG. 2 illustrates a cross-sectional view of an example of a semiconductor package structure according to some embodiments of the present disclosure.

FIG. 2 illustrates a cross-sectional view of an example of a semiconductor package structure 1b according to some embodiments of the present disclosure. The semiconductor package structure 1b of FIG. 2 has a structure similar to that of the semiconductor package structure 1a of FIG. 1 with differences that the material of the portion 121' and the portion 122' of the dielectric structure 120.

In some embodiments, the material of the portion 121' is different from that of the portion 122'. In some embodiments, the material of the portion 121' may include epoxy molding compound, ABF or other suitable materials. In some embodiments, the material of the portion 122' may include a photosensitive material such as parylene, solder resist, or other suitable materials, which can be photocured to become a photocured material. The different materials of the portion 121' and the portion 122' may improve the flexibility of process. For example, if a parylene film is used, a laser drilling technique may be performed on the parylene film. The laser drilling technique may assist in forming opening(s) with smaller aperture to satisfy demands of various semiconductor package structures. In this embodiment, the bottom surface of the portion 121' may be completely covered by the portion 122'.

Figure 3:
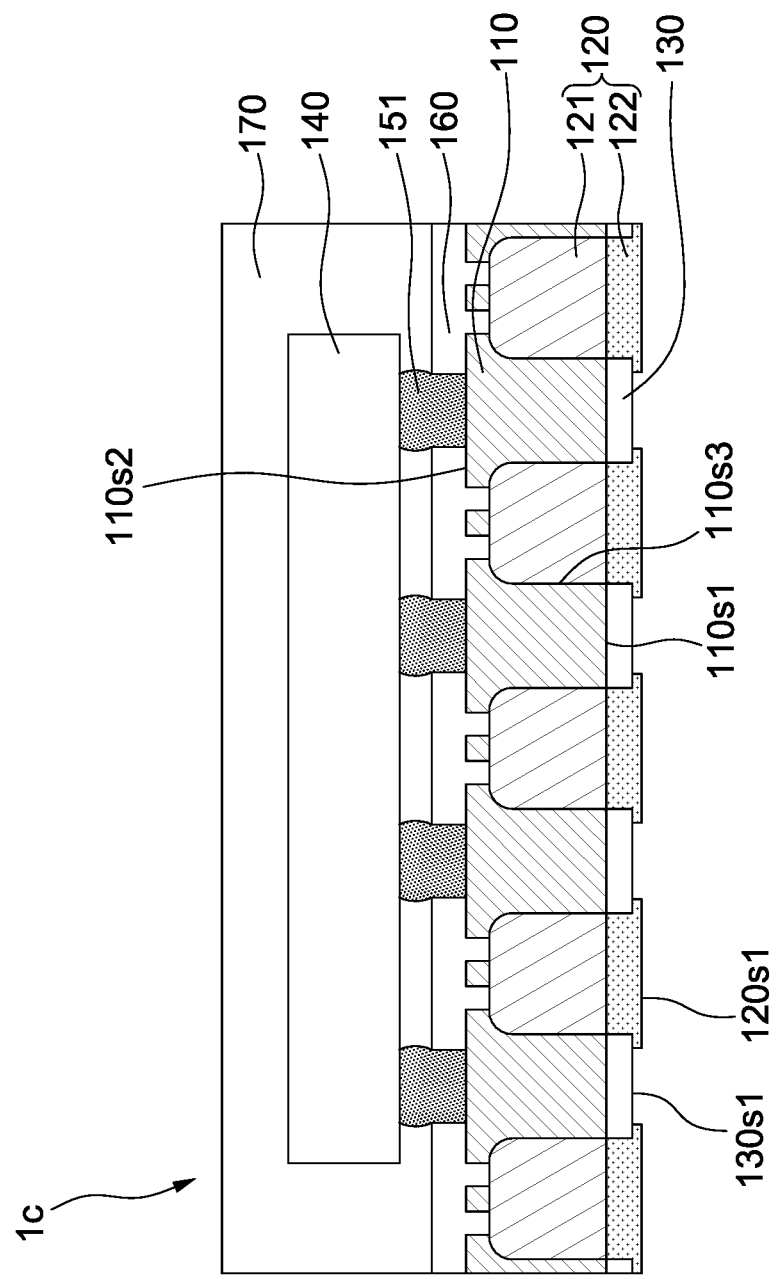
FIG. 3 illustrates a cross-sectional view of an example of a semiconductor package structure according to some embodiments of the present disclosure.

FIG. 3 illustrates a cross-sectional view of an example of a semiconductor package structure 1c according to some embodiments of the present disclosure. The semiconductor package structure 1c of FIG. 3 has a structure similar to that of the semiconductor package structure 1a of FIG. 1 with differences that the dielectric structure 120 of the semiconductor package structure 1c may cover a portion of the protection layer 130.

In some embodiments, a portion of the surface 130s1 of the protection layer 130 may be covered by the protection layer dielectric structure 120. In some embodiments, the width of the protection layer 130 may be substantially equal to the width of the surface 110s1 of each of the sections 1101, 1102, 1103 and 1104 of the circuit layer 110. In some embodiments, a portion of the protection layer 130 may be disposed between the surface 120s1 of the dielectric structure 120 and the surface 110s1 of the circuit layer 110. In some embodiments, the corner, defined by the surface 110s1 and the surface 110s3, of the circuit layer 110 is covered by the dielectric structure 120 and the protection layer 130. In this embodiment, a portion of the protection layer 130 is covered by the dielectric structure 120, which may further protect the circuit layer 110 from oxidation.

Figure 4:
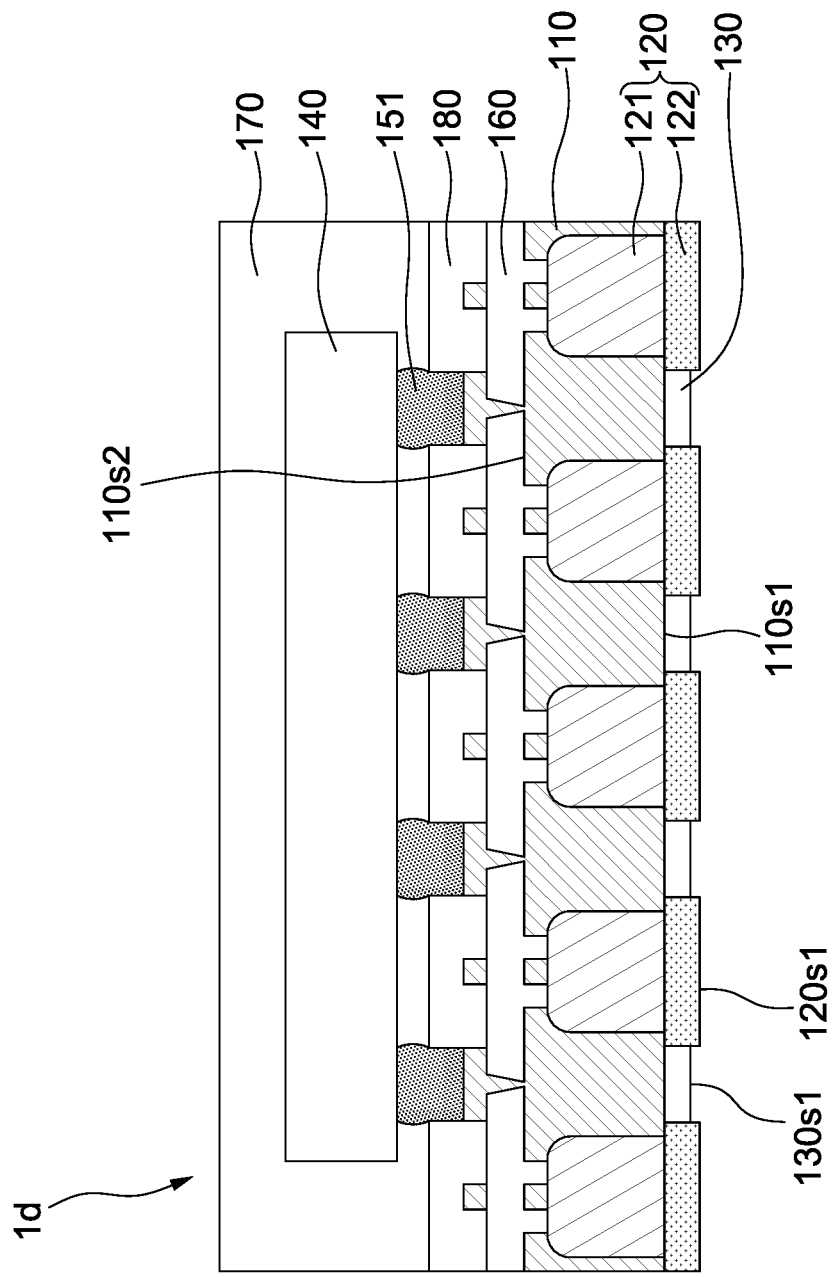
FIG. 4 illustrates a cross-sectional view of an example of a semiconductor package structure according to some embodiments of the present disclosure.

FIG. 4 illustrates a cross-sectional view of an example of a semiconductor package structure 1d according to some embodiments of the present disclosure. The semiconductor package structure 1d of FIG. 4 has a structure similar to that of the semiconductor package structure 1a of FIG. 1 with differences that the semiconductor package structure 1d may further include a circuit layer 180.

The circuit layer 180 may be disposed on the surface 110s2 of the circuit layer 110. The circuit layer 180 may be disposed between the mask layer 160 and the electronic component 140. The circuit layer 180 may include a dielectric layer, conductive trace(s) and via(a). The circuit layer 180 may serve as a redistribution layer to electrically connecting the circuit layer 110 and the electronic component 140.

Figure 5:
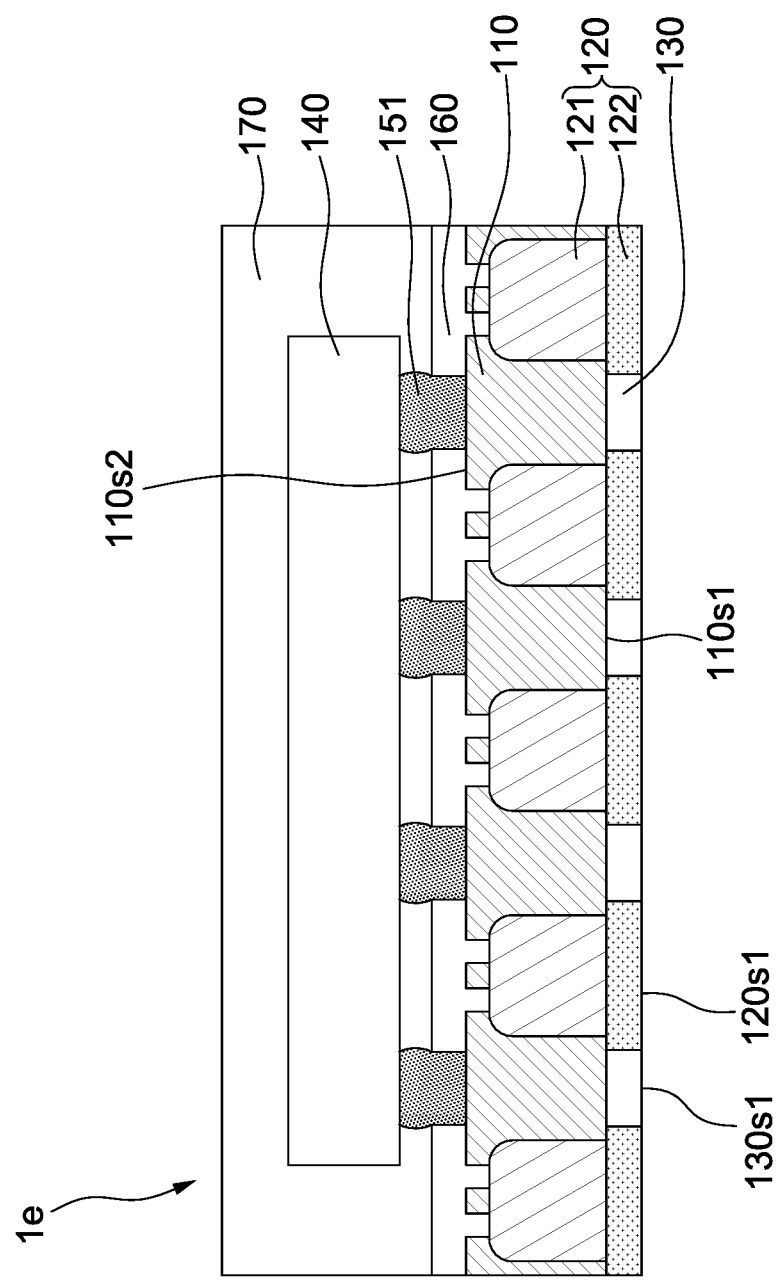
FIG. 5 illustrates a cross-sectional view of an example of a semiconductor package structure according to some embodiments of the present disclosure.

FIG. 5 illustrates a cross-sectional view of an example of a semiconductor package structure 1e according to some embodiments of the present disclosure. The semiconductor package structure 1e of FIG. 5 has a structure similar to that of the semiconductor package structure 1a of FIG. 1 except the dielectric structure 120 of the semiconductor package structure 1e.

In some embodiments, the surface 120s1 of the dielectric structure 120 is substantially coplanar with the surface 130s1 of the protection layer 130. In some embodiments, the thickness of the portion 122 of the dielectric structure 120 may be substantially equal to the thickness of the protection layer 130.

Figure 6:
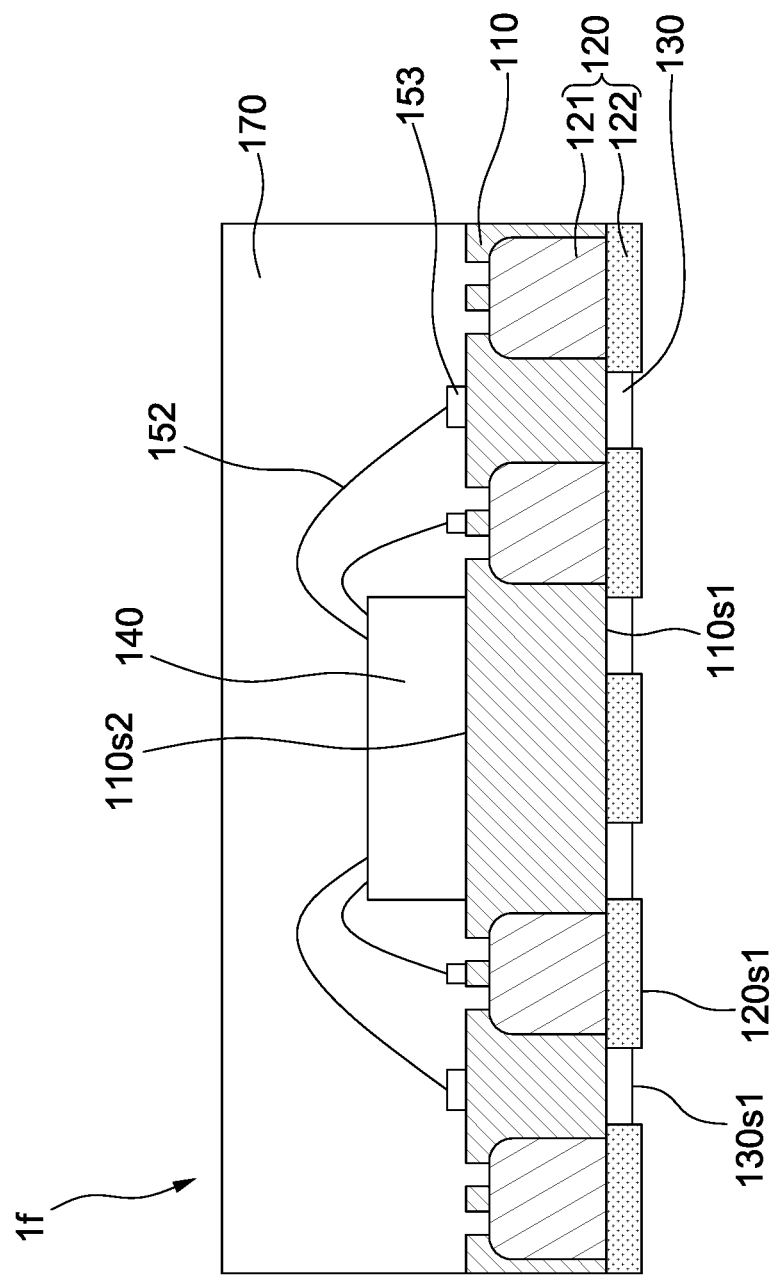
FIG. 6 illustrates a cross-sectional view of an example of a semiconductor package structure according to some embodiments of the present disclosure.

FIG. 6 illustrates a cross-sectional view of an example of a semiconductor package structure 1f according to some embodiments of the present disclosure. The semiconductor package structure 1f of FIG. 6 has a structure similar to that of the semiconductor package structure 1a of FIG. 1 with differences that the semiconductor package structure 1f may further include a wire 152 and a pad 153.

The pad 153 may be disposed on the surface 110s2 of the circuit layer 110. The wire 152 may be configured to electrically connect the circuit layer 110 and the electronic component 140. In this embodiment, the use of the wire 152 and the pad 153 may increase the flexibility of design of the semiconductor package structure 1f.

Figure 7:
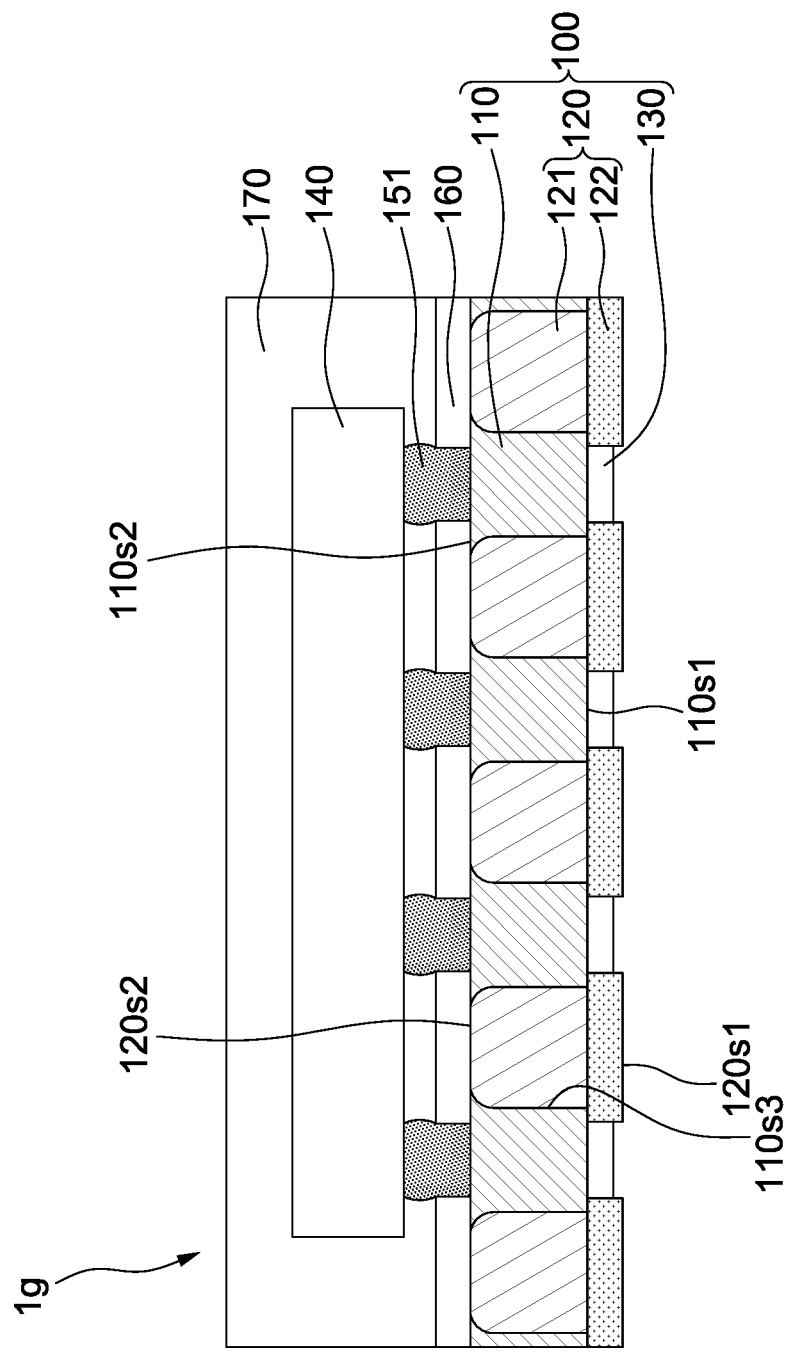
FIG. 7 illustrates a cross-sectional view of an example of a semiconductor package structure according to some embodiments of the present disclosure.

FIG. 7 illustrates a cross-sectional view of an example of a semiconductor package structure 1g according to some embodiments of the present disclosure. The semiconductor package structure 1g of FIG. 7 has a structure similar to that of the semiconductor package structure 1a of FIG. 1 with differences that the surface 120s2 of the dielectric structure 120 may be coplanar with the surface 110s2 of the circuit layer 110, which may increase the flexibility of design of the semiconductor package structure 1g.

FIGS. 8A, 8B, 8C, 8D, 8E, 8F and 8G illustrate various stages of an example of a method for manufacturing a semiconductor package structure according to some embodiments of the present disclosure.

Referring to FIG. 8A, a conductive layer 110' is provided. The conductive layer 110' may be a bulk substrate that is not patterned yet. The conductive layer 110' may have a surface 110s1 and a surface 110s2 opposite to the surface 110s1. In some embodiments, a portion of the conductive layer 110' may be removed to form a plurality of recesses recessed from the surface 110s1 of the conductive layer 110'. Then, a dielectric material may be formed in the plurality of recesses to form a portion 121 (or a dielectric layer). The portion 121 may be embedded in the conductive layer 110'. The bottom surface of the portion 121 may be exposed from the surface 110s1 of the conductive layer 110'. The bottom surface of the portion 121 may be coplanar with the surface 110s1 of the conductive layer 110'.

Referring to FIG. 8B, a portion 122 (or a dielectric layer) may be formed on the surface 110s1 of the conductive layer 110' to cover a portion of the surface 110s1 of the conductive layer 110' and the portion 121. In some embodiments, a dielectric material may be formed on the surface 110s1 of the conductive layer 110'. Then, an etching technique may be performed to form a plurality of openings 120h to expose a portion of the surface 110s1 of the conductive layer 110', and the dielectric structure 120 is produced. The width of the opening 120h may be controlled such that the portion 122 of the dielectric structure 120 covers the surface 110s1 of the conductive layer 110'.

Referring to FIG. 8C, a protection layer 130 may be formed in the openings 120h of the dielectric structure 120. In some embodiments, the protection layer 130 may be a metal finish layer, such as NiAu, NiPd, NiPdAu or other suitable materials. In this embodiment, the protection layer 130 may be formed by an electroplating technique. In this embodiment, the protection layer 130 is formed before patterning the conductive layer 110' such that the protection layer 130 may completely cover the portion of the surface 110s1 that is exposed form the dielectric structure 120.

Referring to FIG. 8D, the conductive layer 110' may be thinned. In some embodiments, a removing technique, such as a mechanical polish technique, may be performed on the surface 110s2 of the conductive layer 110' to thin the thickness of the conductive layer 110'. Alternatively, the thinning operation may be one of etching.

Figure 8E:
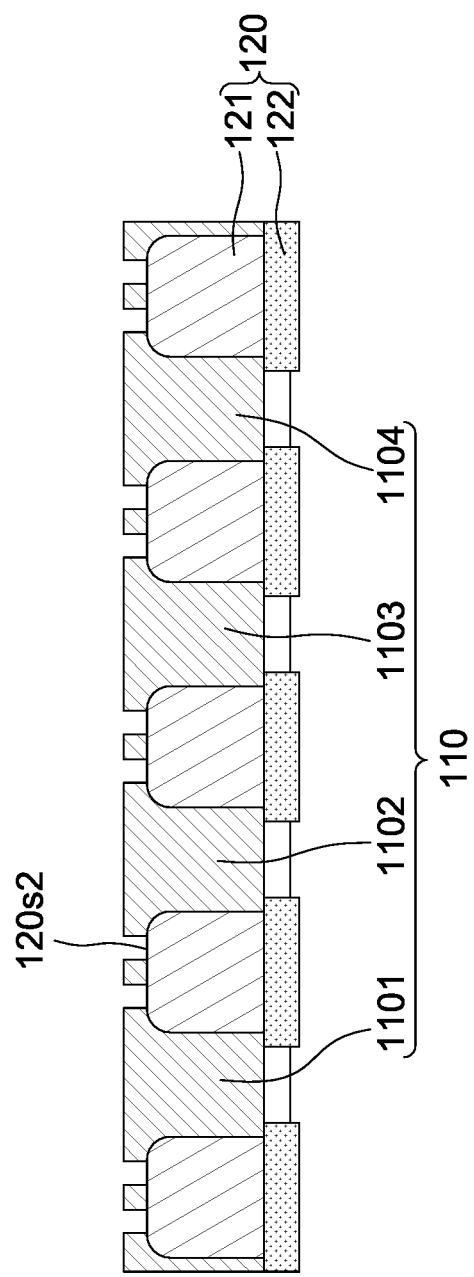

Referring to FIG. 8E, the conductive layer 110' may be pattern by a patterning technique to remove a portion of the conductive layer 110' such that a portion of the surface 120s2 of the dielectric structure 120 is exposed. The patterning technique may include, for example, an etching technique. The etching technique may include dry etching, wet etching or other suitable techniques. After the patterning technique, sections 1101, 1102, 1103 and 1104 that are separated from each other are formed, and the circuit layer 110 is produced.

Figure 8F:
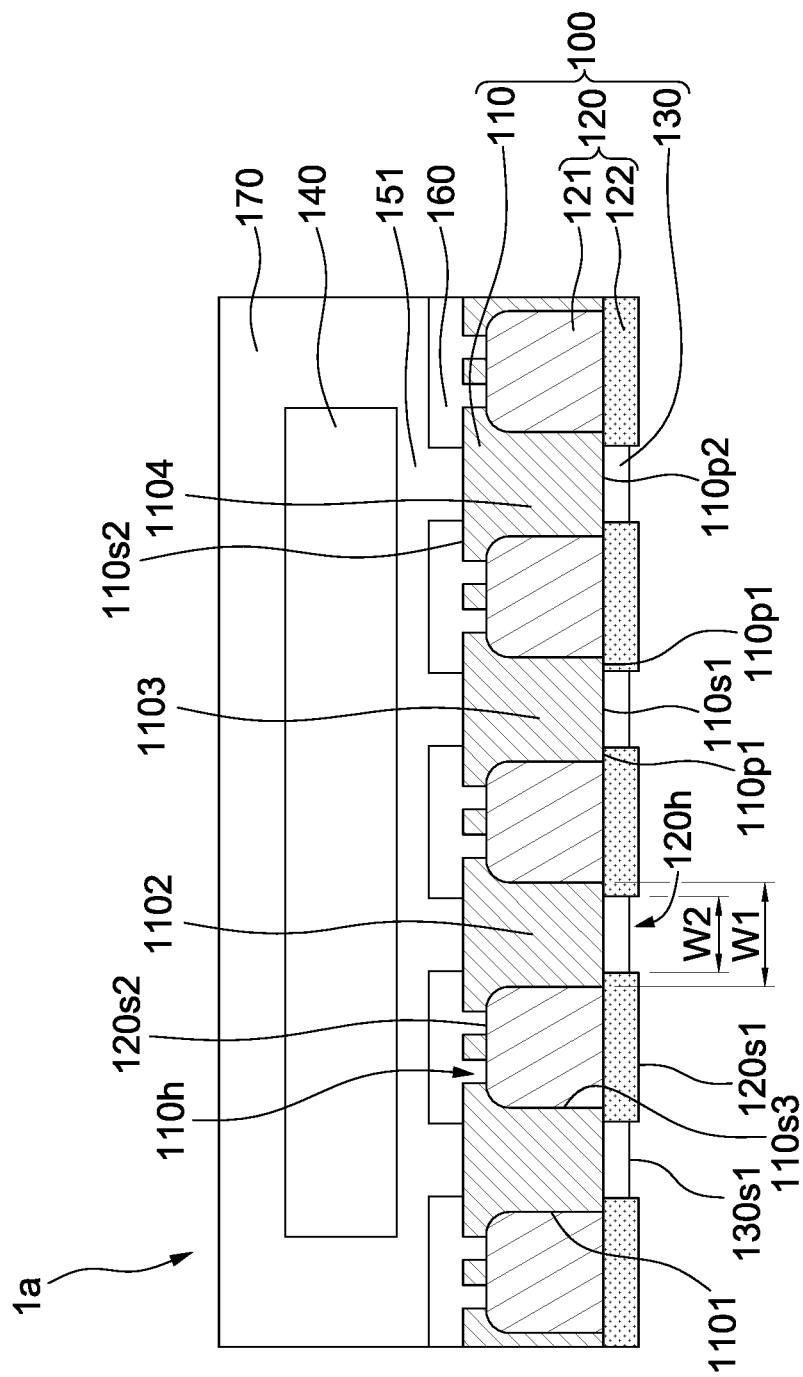

Referring to FIG. 8F, an electronic component 140, solder balls 151, a mask layer 160 and a package body 170 may be formed, and a semiconductor package structure, such as the semiconductor package structure 1a shown in FIG. 1, is produced. Since in the stage shown in FIG. 8B, the portion 122 is formed to cover a portion of the conductive layer 110', the corner defined by the surface 110s1 and surface 110s3 is locked by the dielectric structure 120. Therefore, the stress imposed on the corner may be reduced, and delamination of the semiconductor package structure 1a may be prevented. Further, in this embodiment, the protection layer 130 is formed before forming the separated sections 1101, 1102, 1103 and 1104. Once the separated sections 1101, 1102, 1103 and 1104 are formed prior to the formation of the protection layer 130, the protection layer 130, which is formed by electroplating technique, cannot be formed on each of the sections 1101, 1102, 1103 and 1104 because of electrical isolation of the sections 1101, 1102, 1103 and 1104. In this embodiment, the protection layer 130 is formed to cover the exposed surface 110s1 of the circuit layer 110, and cover the surface 110s1 of each of separated sections 1101, 1102, 1103 and 1104 of the circuit layer 110. Therefore, oxidation of the circuit layer 110 may be prevent during the subsequent stages.

Figure 9C:
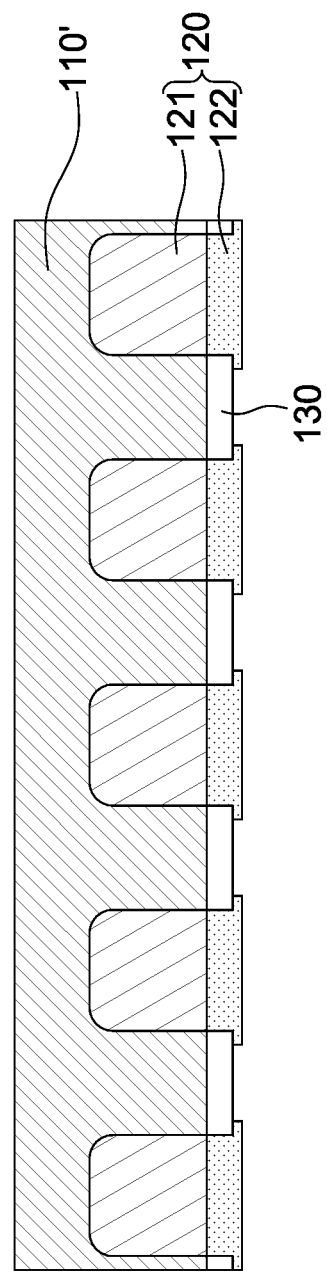

FIGS. 9A, 9B, 9C and 9D illustrate various stages of an example of a method for manufacturing a semiconductor package structure according to some embodiments of the present disclosure. The initial stage of the illustrated process is the same as, or similar to, the stage illustrated in FIG. 8A. FIG. 9A depicts a stage subsequent to that depicted in FIG. 8A.

Referring to FIG. 9A, a protection layer 130 may be formed on the surface 110s1 of the circuit layer 110 prior to the formation of the portion 122. In this embodiment, the surface 110s1 of the circuit layer 110 may be completely covered by the protection layer 130.

Referring to FIG. 9B, a dielectric material 123 may be formed to cover the protection layer 130 and the portion 121.

Referring to FIG. 9C, a portion of the dielectric material 123 may be removed to form the portion 122, and the dielectric structure 120 is produced. A portion of the protection layer 130 may be covered by the portion 122 of the dielectric structure 120.

Figure 9D:
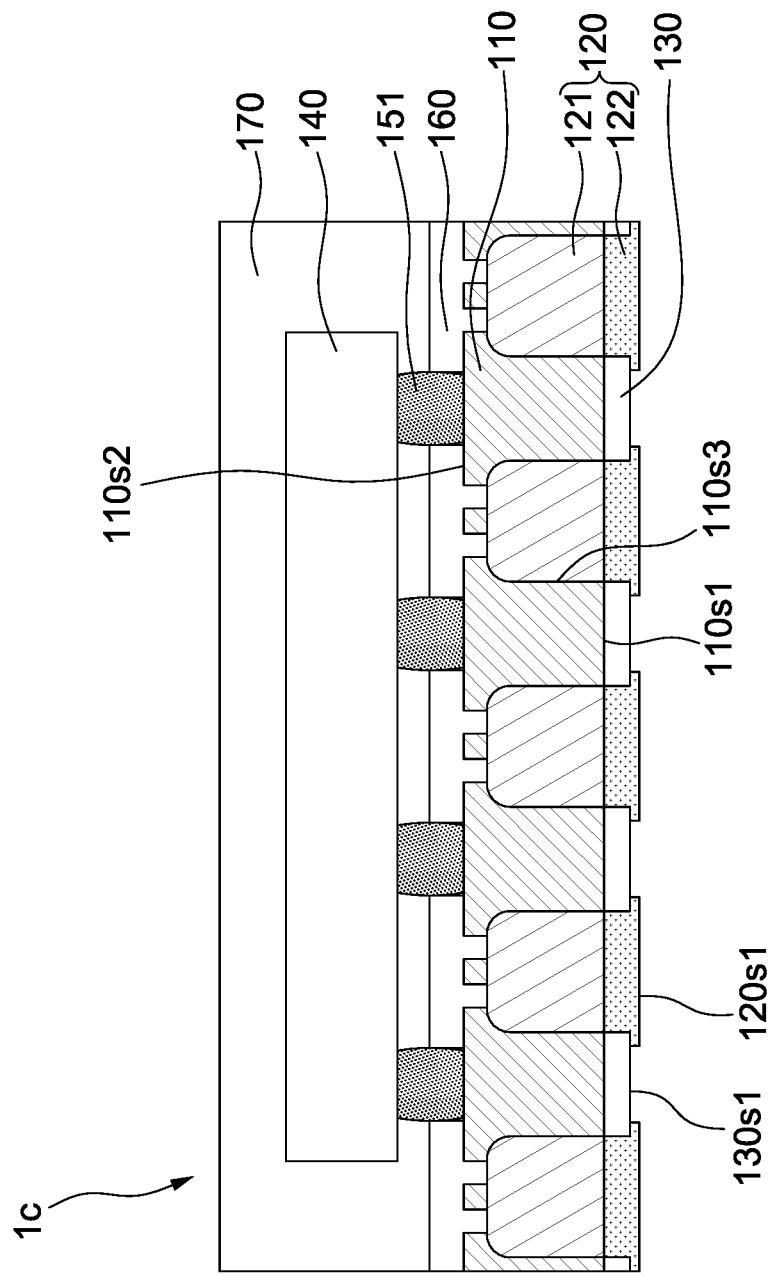

Referring to FIG. 9D, the conductive layer 110' may be thinned and patterned, and an electronic component 140, a solder ball 151, a mask layer 160 and a package body 170 may be formed. As a result, a semiconductor package structure, such as semiconductor package structure 1c shown in FIG. 3, is produced. The stages from FIG. 9C to FIG. 9D may be the same as or similar to those from FIG. 8C to FIG. 8F.

Figure 10A:
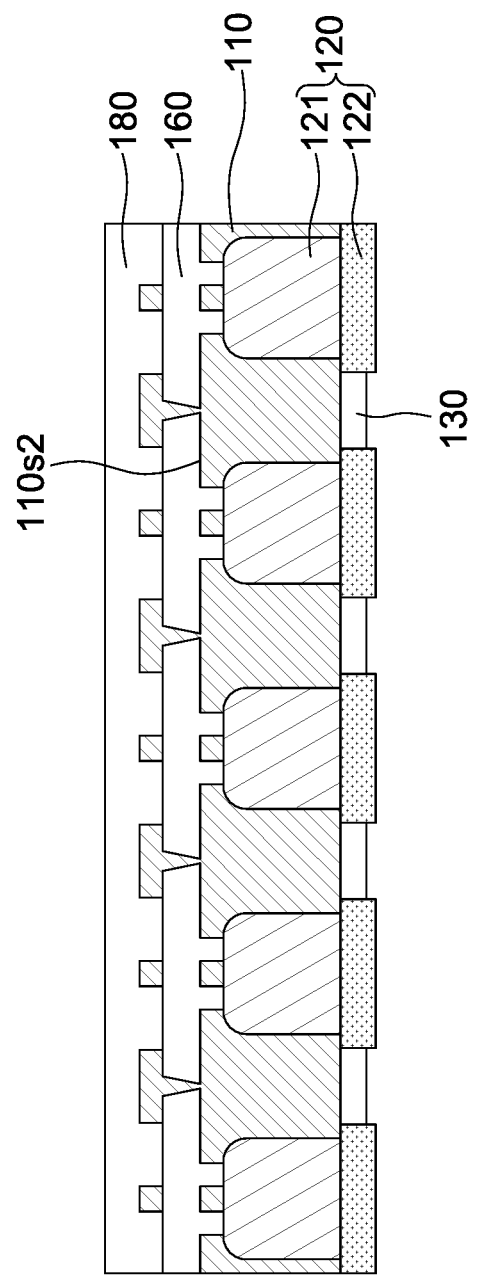
FIGS. 10A and 10B illustrate various stages of an example of a method for manufacturing a semiconductor package structure according to some embodiments of the present disclosure.
Figure 10B:
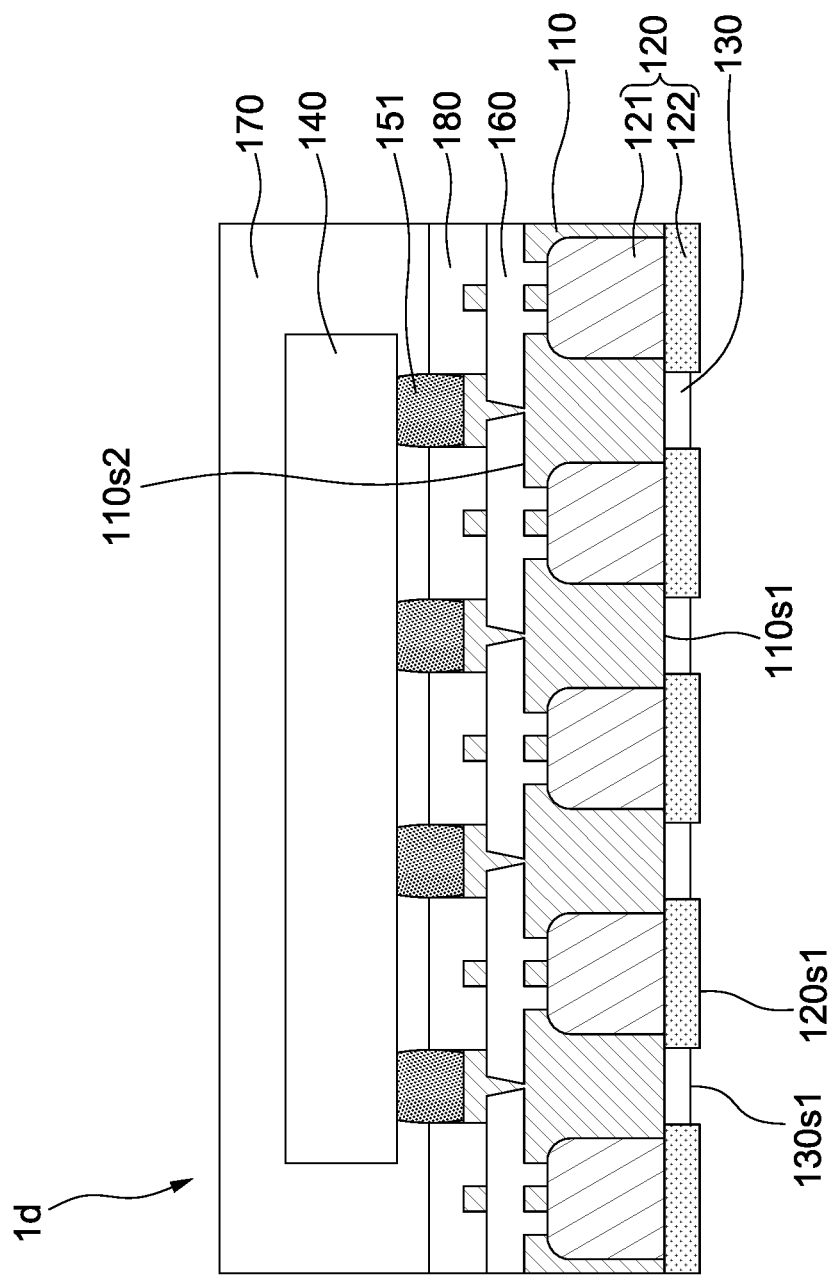

FIGS. 10A and 10B illustrate various stages of an example of a method for manufacturing a semiconductor package structure according to some embodiments of the present disclosure. The initial stage of the illustrated process is the same as, or similar to, the stage illustrated in FIG. 8A through FIG. 8E. FIG. 10A depicts a stage subsequent to that depicted in FIG. 8E.

Referring to FIG. 10A, after the protection layer 130 and the mask layer 160 are formed, a circuit layer 180 may be formed on the surface 110s2 of the circuit layer 110. In some embodiments, a dielectric material may be formed to cover the mask layer 160. Then, an etching technique may be performed to define a plurality of openings, and a conductive material may be deposited to fill the openings and then patterned to form the circuit layer 180.

Referring to FIG. 10B, an electronic component 140, solder balls 151 and a package body 170 may be formed, and a semiconductor package structure, such as semiconductor package structure 1d shown in FIG. 4, is produced.

Figure 11A:
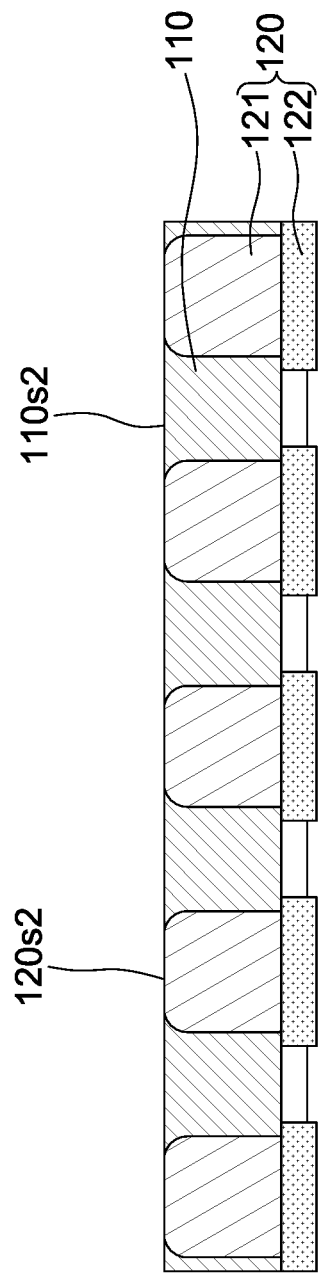
FIGS. 11A and 11B illustrate various stages of an example of a method for manufacturing a semiconductor package structure according to some embodiments of the present disclosure.
Figure 11B:
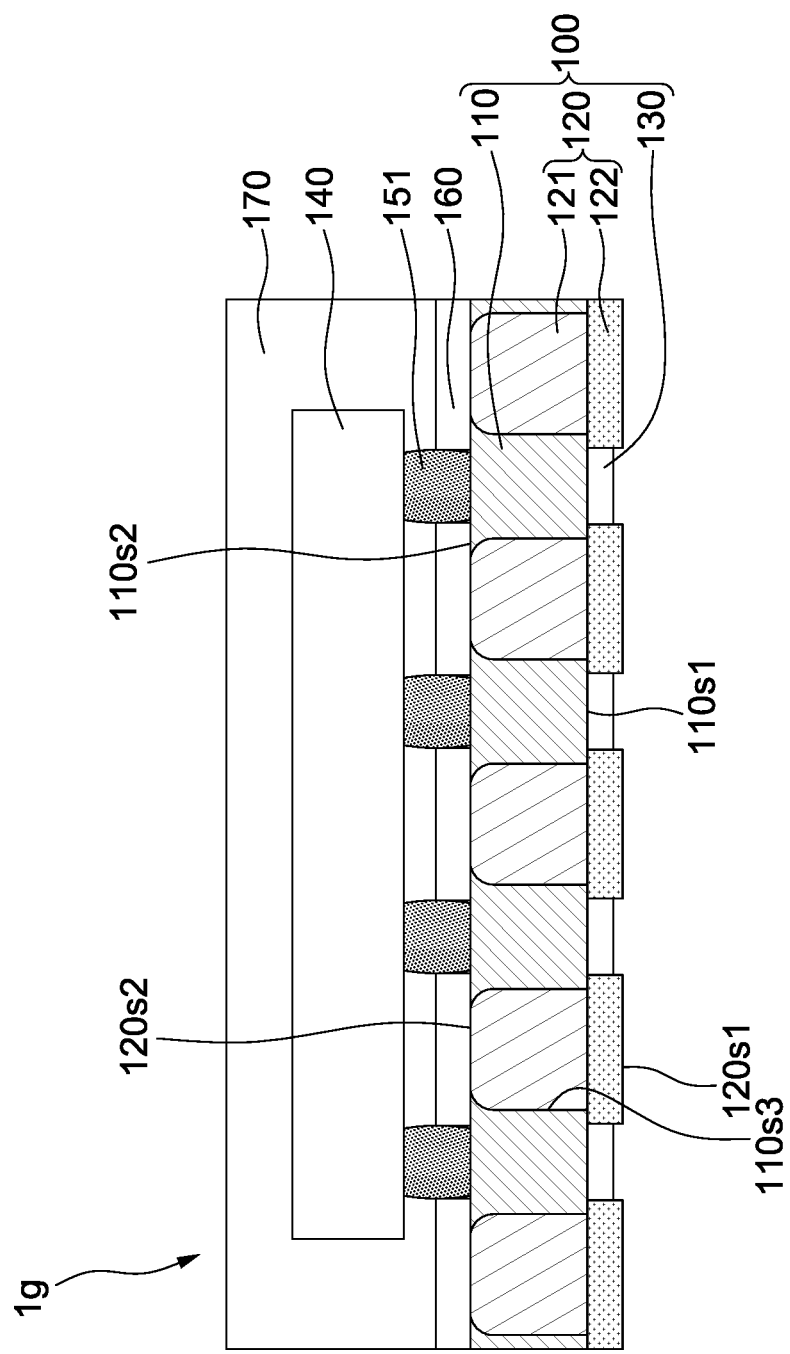

FIGS. 11A and 11B illustrate various stages of an example of a method for manufacturing a semiconductor package structure according to some embodiments of the present disclosure. The initial stage of the illustrated process is the same as, or similar to, the stage illustrated in FIG. 8A through FIG. 8D. FIG. 11A depicts a stage subsequent to that depicted in FIG. 8D.

Referring to FIG. 11A, the circuit layer 110 may be thinned until a surface 120s2 of the dielectric structure 120 is coplanar with the surface 110s2 of the circuit layer 110.

Referring to FIG. 11B, an electronic component 140, solder balls 151 and a package body 170 may be formed, and a semiconductor package structure, such as semiconductor package structure 1g shown in FIG. 7, is produced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
   a circuit layer having a bottom surface and a top surface opposite to the bottom surface;
   a dielectric structure around the circuit layer, wherein the dielectric structure covers a first part of the bottom surface of the circuit layer, and exposes a second part of the bottom surface, and wherein the dielectric structure exposes the top surface of the circuit layer;
   an electronic component disposed on the top surface of the circuit layer, wherein the circuit layer defines a plurality of trace spaces extending from the top surface of the circuit layer toward the dielectric structure and exposing the dielectric structure, the circuit layer comprising portions on top surfaces of the dielectric structure in the trace spaces;
   a mask layer disposed on the top surface of the circuit layer and disposed in the plurality of trace spaces of the circuit layer; and
   a plurality of conductors electrically connected to the circuit layer and the electronic component.

2. The semiconductor package structure of claim 1, further comprising:
   a second circuit layer disposed between the electronic component and the top surface of the circuit layer.

3. The substrate structure of claim 1, wherein the dielectric structure defines an opening exposing the second part of the bottom surface of the circuit layer.

4. The substrate structure of claim 3, further comprising:
   a protection layer disposed in the opening defined by the dielectric structure, wherein the first part of the bottom surface of the circuit layer is free from vertically overlapping the protection layer.

5. The substrate structure of claim 3, further comprising:
   a protection layer disposed in the opening defined by the dielectric structure, wherein a portion of the protection layer is covered by the dielectric structure.

6. The substrate structure of claim 4, wherein a bottom surface of the protection layer is recessed from a bottom surface of the dielectric structure.

7. The substrate structure of claim 4, wherein the protection layer comprises a metal or an organic solderability preservative.

8. The substrate structure of claim 1, wherein the dielectric structure comprises a first portion and a second portion, the first portion of the dielectric structure covers a lateral surface of the circuit layer, the second portion of the dielectric structure covers the bottom surface of the circuit layer, and the lateral surface of the circuit layer extends between the bottom surface and the top surface of the circuit layer, and wherein a material of the first portion of the dielectric structure is different from a material of the second portion of the dielectric structure.

9. The substrate structure of claim 8, wherein the material of the second portion of the dielectric structure comprises a photocured material.

* * * * *